(12) United States Patent  (10) Patent No.: US 8,179,034 B2
Potts et al.  (45) Date of Patent: May 15, 2012

(54) LIGHT EXTRACTION FILM FOR ORGANIC LIGHT EMITTING DIODE DISPLAY AND LIGHTING DEVICES

(75) Inventors: John E. Potts, Woodbury, MN (US); Fred B. McCormick, Maplewood, MN (US); Martin B. Wolk, Woodbury, MN (US); Jun-Ying Zhang, Woodbury, MN (US); Terry L. Smith, Roseville, MN (US); James M. Battiato, Austin, TX (US); Ding Wang, Austin, TX (US); William A. Tolbert, Woodbury, MN (US); Mark A. Roehrig, Stillwater, MN (US); Clark I. Bright, Tucson, AZ (US)

(73) Assignee: 3M Innovative Properties Company, Saint Paul, MN (US)

( * ) Notice: Subject to any disclaimer, the term of this patent is extended or adjusted under 35 U.S.C. 154(b) by 181 days.

(21) Appl. No.: 11/777,461

(22) Filed: Jul. 13, 2007

(65) Prior Publication Data

US 2009/0015757 A1    Jan. 15, 2009

(51) Int. Cl.
*H01L 51/50* (2006.01)
(52) U.S. Cl. .......................................... 313/504; 445/24
(58) Field of Classification Search .................... 313/504
See application file for complete search history.

(56) References Cited

U.S. PATENT DOCUMENTS

| | | |
|---|---|---|
| 3,739,217 A | 6/1973 | Bergh et al. |
| 4,080,245 A | 3/1978 | Yamanaka et al. |
| 4,374,077 A | 2/1983 | Kerfeld |
| 4,576,850 A | 3/1986 | Martens |
| 4,816,717 A | 3/1989 | Harper et al. |
| 4,842,893 A | 6/1989 | Yializis et al. |
| 4,856,014 A | 8/1989 | Figueroa et al. |
| 5,175,030 A | 12/1992 | Lu et al. |
| 5,271,968 A | 12/1993 | Coyle et al. |
| 5,405,710 A | 4/1995 | Dodabalapur et al. |
| 5,440,446 A | 8/1995 | Shaw et al. |

(Continued)

FOREIGN PATENT DOCUMENTS

EP    1 643 809 A1    4/2006

(Continued)

OTHER PUBLICATIONS

Extraordinary transmission of organic photoluminescence through an otherwise opaque metal layer via surface Plasmon cross coupling, Applied Physics Letters, vol. 80, No. 20, May 20, 2002 Dawn K. Gifford, pp. 3679-3681.

(Continued)

*Primary Examiner* — Toan Ton
*Assistant Examiner* — Andrew Coughlin

(57) ABSTRACT

A multifunctional optical film for enhancing light extraction includes a flexible substrate, a structured layer, and a backfill layer. The structured layer effectively uses microreplicated diffractive or scattering nanostructures located near enough to the light generation region to enable extraction of an evanescent wave from an organic light emitting diode (OLED) device. The backfill layer has a material having an index of refraction different from the index of refraction of the structured layer. The backfill layer also provides a planarizing layer over the structured layer in order to conform the light extraction film to a layer of an OLED lighting device such as solid state lighting devices or backlight units. The film may have additional layers added to or incorporated within it to an emissive surface in order to effect additional functionalities beyond improvement of light extraction efficiency.

8 Claims, 4 Drawing Sheets

U.S. PATENT DOCUMENTS

| | | | |
|---|---|---|---|
| 5,558,740 A | 9/1996 | Bernard et al. | |
| 5,804,919 A | 9/1998 | Jacobsen et al. | |
| 5,814,416 A | 9/1998 | Dodabalapur et al. | |
| 5,834,893 A | 11/1998 | Bulovic et al. | |
| 5,877,895 A | 3/1999 | Shaw et al. | |
| 5,936,347 A | 8/1999 | Isaka et al. | |
| 5,952,778 A | 9/1999 | Haskal et al. | |
| 5,955,837 A | 9/1999 | Horikx et al. | |
| 5,995,690 A | 11/1999 | Kotz et al. | |
| 6,005,137 A | 12/1999 | Moore et al. | |
| 6,010,751 A | 1/2000 | Shaw et al. | |
| 6,015,719 A | 1/2000 | Kish, Jr. et al. | |
| 6,125,226 A | 9/2000 | Forrest et al. | |
| 6,133,692 A | 10/2000 | Xu et al. | |
| 6,140,764 A | 10/2000 | Xu et al. | |
| 6,217,984 B1 | 4/2001 | Bruxvoort et al. | |
| 6,252,253 B1 | 6/2001 | Bao et al. | |
| 6,278,237 B1 | 8/2001 | Campos | |
| 6,322,652 B1 | 11/2001 | Paulson et al. | |
| 6,329,058 B1 | 12/2001 | Arney et al. | |
| 6,362,566 B2 | 3/2002 | Xu et al. | |
| 6,392,338 B1 | 5/2002 | Hori et al. | |
| 6,416,838 B1 | 7/2002 | Arney et al. | |
| 6,432,526 B1 | 8/2002 | Arney et al. | |
| 6,432,546 B1 | 8/2002 | Ramesh et al. | |
| 6,441,551 B1 | 8/2002 | Abe et al. | |
| 6,476,550 B1 | 11/2002 | Oda et al. | |
| 6,504,180 B1 | 1/2003 | Heremans et al. | |
| 6,512,250 B1 | 1/2003 | Koyama et al. | |
| 6,605,483 B2 | 8/2003 | Victor et al. | |
| 6,617,784 B1 | 9/2003 | Abe et al. | |
| 6,638,606 B2 | 10/2003 | Yoshihara et al. | |
| 6,640,034 B1 | 10/2003 | Charlton et al. | |
| 6,657,236 B1 | 12/2003 | Thibeault et al. | |
| 6,680,578 B2 | 1/2004 | Antoniadis et al. | |
| 6,703,780 B2 | 3/2004 | Shiang et al. | |
| 6,734,624 B2 | 5/2004 | Tada et al. | |
| 6,771,018 B2 | 8/2004 | Toguchi et al. | |
| 6,775,448 B2 | 8/2004 | Zoorob | |
| 6,777,070 B1 | 8/2004 | Murata et al. | |
| 6,777,871 B2 | 8/2004 | Duggal et al. | |
| 6,778,746 B2 | 8/2004 | Charlton et al. | |
| 6,787,796 B2 | 9/2004 | Do et al. | |
| 6,831,302 B2 | 12/2004 | Erchak et al. | |
| 6,857,759 B2 | 2/2005 | Lee et al. | |
| 6,873,099 B2 | 3/2005 | Maeda | |
| 6,888,994 B2 | 5/2005 | Baumberg et al. | |
| 6,900,457 B2 | 5/2005 | Toguchi et al. | |
| 6,901,194 B2 | 5/2005 | Charlton et al. | |
| 6,924,160 B2 | 8/2005 | Wei et al. | |
| 6,936,100 B2 | 8/2005 | Tadakuma | |
| 6,952,079 B2 | 10/2005 | Shiang et al. | |
| 6,959,127 B2 | 10/2005 | Zoorob | |
| 6,965,197 B2 | 11/2005 | Tyan et al. | |
| 6,967,437 B1 | 11/2005 | Samuel et al. | |
| 6,975,067 B2 | 12/2005 | McCormick et al. | |
| 6,984,934 B2 | 1/2006 | Moller et al. | |
| 6,998,775 B2 | 2/2006 | Sugiura et al. | |
| 7,012,363 B2 | 3/2006 | Weaver et al. | |
| 7,030,555 B2 | 4/2006 | Nakamura et al. | |
| 7,030,556 B2 | 4/2006 | Adachi et al. | |
| 7,038,373 B2 | 5/2006 | Arnold et al. | |
| 7,045,195 B2 | 5/2006 | Ozin et al. | |
| 7,053,547 B2 | 5/2006 | Lu et al. | |
| 7,084,565 B2 | 8/2006 | Cho et al. | |
| 7,094,122 B2 | 8/2006 | Toguchi et al. | |
| 7,102,282 B1 | 9/2006 | Yamada et al. | |
| 7,109,651 B2 | 9/2006 | Nakamura et al. | |
| 7,156,942 B2 | 1/2007 | McCormick et al. | |
| 7,166,010 B2 | 1/2007 | Lamansky et al. | |
| 7,245,065 B2 | 7/2007 | Ghosh et al. | |
| 7,256,541 B2 | 8/2007 | Birnstock et al. | |
| 7,264,872 B2 | 9/2007 | Walker, Jr. et al. | |
| 7,391,046 B2 | 6/2008 | Tsutsumi et al. | |
| 7,508,130 B2 | 3/2009 | Cok | |
| 2001/0026124 A1 | 10/2001 | Liu et al. | |
| 2001/0033135 A1 | 10/2001 | Duggal et al. | |
| 2002/0021445 A1 | 2/2002 | Bozhevolnyi et al. | |
| 2002/0024051 A1 | 2/2002 | Yamazaki et al. | |
| 2002/0045030 A1 | 4/2002 | Ozin et al. | |
| 2003/0003300 A1 | 1/2003 | Korgel et al. | |
| 2003/0031438 A1 | 2/2003 | Kambe et al. | |
| 2003/0038596 A1 | 2/2003 | Ho | |
| 2003/0098856 A1 | 5/2003 | Li | |
| 2003/0127973 A1* | 7/2003 | Weaver et al. | 313/504 |
| 2003/0141507 A1 | 7/2003 | Krames et al. | |
| 2004/0004433 A1 | 1/2004 | Lamansky et al. | |
| 2004/0012328 A1 | 1/2004 | Arnold et al. | |
| 2004/0027062 A1 | 2/2004 | Shiang et al. | |
| 2004/0033369 A1 | 2/2004 | Fleming et al. | |
| 2004/0041164 A1* | 3/2004 | Thibeault et al. | 257/98 |
| 2004/0046499 A1 | 3/2004 | Park et al. | |
| 2004/0080938 A1 | 4/2004 | Holman et al. | |
| 2004/0169465 A1 | 9/2004 | Do et al. | |
| 2004/0188689 A1 | 9/2004 | Shono et al. | |
| 2004/0217702 A1 | 11/2004 | Garner et al. | |
| 2004/0262614 A1 | 12/2004 | Hack et al. | |
| 2005/0018431 A1 | 1/2005 | Shiang | |
| 2005/0023967 A1 | 2/2005 | Gotoh et al. | |
| 2005/0035346 A1 | 2/2005 | Bazan et al. | |
| 2005/0035361 A1 | 2/2005 | Peterson et al. | |
| 2005/0084994 A1 | 4/2005 | Yamazaki et al. | |
| 2005/0116625 A1 | 6/2005 | Park et al. | |
| 2005/0122035 A1 | 6/2005 | Birnstock et al. | |
| 2005/0127832 A1 | 6/2005 | Toguchi et al. | |
| 2005/0142379 A1 | 6/2005 | Juni et al. | |
| 2005/0156512 A1 | 7/2005 | Savvateev et al. | |
| 2005/0175796 A1 | 8/2005 | Nakamura et al. | |
| 2005/0194896 A1 | 9/2005 | Sugita et al. | |
| 2005/0206311 A1 | 9/2005 | Bechtel et al. | |
| 2005/0231102 A1 | 10/2005 | Chao et al. | |
| 2005/0285128 A1 | 12/2005 | Scherer et al. | |
| 2006/0027815 A1 | 2/2006 | Wierer, Jr. et al. | |
| 2006/0038190 A1 | 2/2006 | Park et al. | |
| 2006/0043400 A1 | 3/2006 | Erchak et al. | |
| 2006/0049745 A1 | 3/2006 | Handa et al. | |
| 2006/0055319 A1* | 3/2006 | Uemura et al. | 313/504 |
| 2006/0062540 A1 | 3/2006 | Zoorob et al. | |
| 2006/0063015 A1 | 3/2006 | McCormick et al. | |
| 2006/0066220 A1 | 3/2006 | Choong et al. | |
| 2006/0147674 A1 | 7/2006 | Walker, Jr. et al. | |
| 2006/0151793 A1 | 7/2006 | Nagai | |
| 2006/0170341 A1* | 8/2006 | Su et al. | 313/512 |
| 2006/0174994 A1 | 8/2006 | White | |
| 2006/0175961 A1 | 8/2006 | Choong | |
| 2006/0186802 A1 | 8/2006 | Cok et al. | |
| 2006/0186803 A1 | 8/2006 | Lim et al. | |
| 2006/0215958 A1 | 9/2006 | Yeo et al. | |
| 2006/0220539 A1 | 10/2006 | Cok et al. | |
| 2006/0232195 A1 | 10/2006 | Cok et al. | |
| 2006/0250084 A1 | 11/2006 | Cok et al. | |
| 2006/0269733 A1 | 11/2006 | Mizuno et al. | |
| 2006/0290272 A1 | 12/2006 | Haenichen | |
| 2007/0007511 A1 | 1/2007 | Choi et al. | |
| 2007/0013291 A1 | 1/2007 | Cok et al. | |
| 2007/0020451 A1 | 1/2007 | Padiyath et al. | |
| 2007/0063628 A1 | 3/2007 | Cok et al. | |
| 2007/0063641 A1 | 3/2007 | Cok et al. | |
| 2007/0114925 A1* | 5/2007 | Cok | 313/512 |
| 2007/0124121 A1 | 5/2007 | Freier | |
| 2007/0145453 A1 | 6/2007 | Wu et al. | |
| 2007/0200496 A1 | 8/2007 | Cok et al. | |
| 2007/0257608 A1 | 11/2007 | Tyan et al. | |
| 2007/0284601 A1* | 12/2007 | Khanarian | 257/98 |
| 2007/0286944 A1 | 12/2007 | Yokoyama et al. | |
| 2007/0286994 A1 | 12/2007 | Walker et al. | |
| 2008/0006819 A1 | 1/2008 | McCormick et al. | |
| 2008/0018231 A1* | 1/2008 | Hirakata | 313/498 |
| 2008/0035936 A1 | 2/2008 | Lester | |
| 2008/0107993 A1 | 5/2008 | Wolk et al. | |
| 2008/0272689 A1 | 11/2008 | Ide et al. | |
| 2008/0277680 A1 | 11/2008 | Bertram et al. | |
| 2008/0284320 A1* | 11/2008 | Karkkainen | 313/504 |
| 2009/0272996 A1 | 11/2009 | Chakraborty | |

FOREIGN PATENT DOCUMENTS

| | | |
|---|---|---|
| EP | 1 691 429 A2 | 8/2006 |
| EP | 1 518 281 B1 | 3/2007 |
| JP | 1 383 180 A2 | 1/2004 |
| JP | 2005166635 A | 9/2004 |
| JP | 2006100042 | 9/2004 |
| JP | 1 467 415 A2 | 10/2004 |
| JP | 1 548 856 A2 | 6/2005 |
| JP | 1 615 472 A1 | 1/2006 |
| JP | 2007059119 | 3/2007 |
| WO | WO 98/17083 | 4/1998 |
| WO | WO 02/37568 A1 | 5/2002 |
| WO | WO 02/37580 A1 | 5/2002 |
| WO | WO 03/007286 | 1/2003 |
| WO | WO 03/061026 A1 | 7/2003 |
| WO | WO 2004/003607 A2 | 1/2004 |
| WO | WO 2004/084259 A2 | 9/2004 |
| WO | WO 2004/112435 A1 | 12/2004 |
| WO | WO 2005/026793 | 3/2005 |
| WO | WO 2005/064695 A2 | 7/2005 |
| WO | WO 2005/094130 A1 | 10/2005 |
| WO | WO 2005/098986 A1 | 10/2005 |
| WO | WO 2005/103771 A1 | 11/2005 |
| WO | WO 2005/114762 A1 | 12/2005 |
| WO | WO 2006/021070 A1 | 3/2006 |
| WO | WO 2006/023699 A2 | 3/2006 |
| WO | WO 2006/078530 A2 | 7/2006 |
| WO | WO 2006/093749 A2 | 9/2006 |
| WO | WO 2006/110926 A2 | 10/2006 |
| WO | WO 2006/130793 A1 | 12/2006 |
| WO | WO 2006/134218 A1 | 12/2006 |
| WO | WO 2007/005240 A1 | 1/2007 |
| WO | WO 2007/008774 A1 | 1/2007 |
| WO | WO 2007/041116 A1 | 4/2007 |

OTHER PUBLICATIONS

Waveguide analysis of organic light-emitting diodes fabricated on surfaces with wavelength-scale periodic gratings, Applied Optics, vol. 44, No. 16, Jun. 1, 2005, Joseph F. Revelli, pp. 3224-3237.
Improvement of coupling-out efficiency in organic electroluminescent devices by addition of a diffusive layer, Journal of Applied Physics, vol. 96, No. 11, Dec. 1, 2004, Toshitaka Nakamura, pp. 6016-6022.
30% external quantum efficiency from surface textured, thin-film light-emitting diodes, Applied Physics Letters, vol. 63, No. 16, Oct. 18, 1993, I. Schnitzer, pp. 2174-2176.
Surface Plasmon-polariton mediated light emission through thin metal films, Optics Express, vol. 12, No. 16, Aug. 9, 2004, Stephen Wedge, pp. 3673-3685.
Surface Plasmon Mediated Emission from Organic Light-Emitting Diodes, Advanced Materials, vol. 14, No. 19, Oct. 2, 2002, Peter A. Hobson, pp. 1393-1396.
Spontaneous emission control of colloidal nanocrystals using nanoimprinted photonic crystals, Applied Physics Letters, vol. 90, 011115 (2007), V.Reboud, pp. 1-3.
Organic light-emitting device with an ordered monolayer of silica microspheres as a scattering medium, Applied Physics Letters, vol. 76, No. 10, Mar. 6, 2000, Takashi Yamasaki, pp. 1243-1245.
Importance of scattering and absorption for the outcoupling efficiency in organic light-emitting devices, Optical Society of America, vol. 23, No. 5, May 2006, Kristiaan Neyts, pp. 1201-1206.
Self-Organized Photonic Structures in Polymer Light-Emitting Diodes, Advanced Materials, vol. 16, No. 21, Nov. 4, 2004, Guillaume Fichet, pp. 1908-1912.
Theory of light propagation in strongly modulated photonic crystals; Refractionlike behavior in the vicinity of the photonic band gap, Physical Review B, vol. 62, No. 16, Oct. 15, 2000, M. Notomi, pp. 10696-10705.
Quasicrystals step out of the shadows, Materials Today, vol. 9, No. 7-8, Jul.-Aug. 2006, Matthew Peach, pp. 44-47.
Spontaneous Emission Extraction and Purcell Enhancement from Thin-Film 2-D Photonic Crystals, Journal of Lightwave Technology, vol. 17, No. 11, Nov. 1999, Misha Boroditsky, pp. 2096-2112.
Improving the light extraction efficiency of polymeric light emitting diodes using two-dimensional photonic crystals, Organic Electronics 7 (2006), A.M. Adawi, pp. 222-228.
A theoretical and experimental investigation of light extraction from polymer light-emitting diodes, Journal of Applied Physics, vol. 97, No. 064502 (2005), Jonathan M. Ziebarth, pp. 1-7.
Plasmonics: Localization and guiding of electromagnetic energy in metal/dielectric structures, Journal of Applied Physics, vol. 98, No. 011101(2005), Stefan A. Maier, pp. 1-10.
Planarized SiN / spin-on-glass photonic crystal organic light-emitting diodes, Applied Physics Letters, vol. 89, No. 173502 (2006), Yoon-Jae Lee, pp. 1-3.
Planarization for three-dimensional photonic crystals and other multi-level nanoscale structures, Institute of Physics Publishing, vol. 18, No. 035303, G. Subramania, pp. 1-7.
Pixellated Photonic Crystal Films by Selective Photopolymerization, Advanced Materials, vol. 18, 2006, Seung-Kon Lee, pp. 2111-2116.
Organic light-emitting diodes with photonic crystals on glass substrate fabricated by nanoimprint lithography, Applied Physics Letters, vol. 90, No. 111114 (2007), Kuniaki Ishihara, pp. 1-3.
Fabrication of photonic crystals structures on light emitting diodes by nanoimprint lithography, Institute of Physics Publishing, vol. 18, No. 055306 (2007), Sang Hoon Kim, pp. 1-5.
Photonic Quasicrystal patterned LEDs offer a brighter future, Mesophotonics, Note: 012, Issue: 1, pp. 1-2.
Far-field radiation of photonic crystal organic light-emitting diode, Optics Express, vol. 13, No. 15, Jul. 25, 2005, Yong-Jae Lee, pp. 5864-5870.
Enhanced light extraction efficiency from organic light emitting diodes by insertion of a two-dimensional photonic crystal structure, Journal of Applied Physics, vol. 96, No. 12, Dec. 15, 2004, Young Rag Do, pp. 7629-7636.
Outsmarting Waveguide Losses in Thin-Film Light-Emitting Diodes, Advanced Functional Materials, vol. 11, No. 4, Aug. 2001, Klaus Meerholz, pp. 251-253.
Highly-efficient broadband waveguide outcoupling in light-emitting diodes with self-organized polymer blends, Applied Physics Letters, vol. 85, No. 14, Oct. 4, 2004, N. Corcoran, pp. 2965-2967.
Doubling Coupling-Out Efficiency in Organic Ligh-Emitting Devices Using a Thin Silica Aerogel Layer, Advanced Materials, Tetsuo Tsutsui.
Optimizatioin of Light-Diffracting Photonic-Crystals for High Extraction Efficiency LEDs, Journal of Display Technology, vol. 3, No. 2, Jun. 2007, Aurelien David, pp. 133-148.
Optimization of light extraction from OLEDs, Optics Express, vol. 15, No. 8, Apr. 16, 2007, Moxi Cui, pp. 4398-4409.
Light Extraction efficiency of a top-emission organic light-emitting diode with an Yb/Au double-layer cathode and an opaque Si anode, Applied Optics, vol. 45, No. 23, Aug. 10, 2006, G.Z. Ran, pp. 5871-5876.
Efficiency enhancement of an organic light-emitting diode with a cathode forming two-dimensional periodic hole array, Applied Physics Letters, vol. 86, No. 143501 (2005), C. Liu, pp. 1-3.
Increased Efficiency and Controlled Light Output from a Microstructured Light-Emitting Diode, Advanced Materials, 2000, Benjamin J. Matterson.
Enhancement of optical extraction from OLEDS using scattering layers, Proceedings of SPIE, vol. 5724 (2005), R.F. Oulton, pp. 191-201.
Out Coupling Efficiency Enhancement of Organic Light Emitting Devices with Novel Periodic Nanostructures using Nanoimprint Lithography, SID Digest 2006, N. Miura, pp. 946-949.
Enhanced light outcoupling in a thin film by texturing meshed surfaces, Applied Physics Letters, vol. 90, 091102 (2007), Yu-Hung Cheng, pp. 1-3.
General method to evaluate substrate surface modification techniques for light extraction enhancement of organic light emitting diodes, Journal of Applied Physics, vol. 100, 054702 (2006), B.C. Krummacher, pp. 1-6.
Optical and Electrical Characteristics of Organic Light-Emitting Diodes with Two-Dimensional Photonic Crystals in Organic/Electrode Layers, Applied Physics, vol. 44, No. 6A, 2005, Masayuki Fujita, pp. 3669-3677.

Efficient light extraction and beam shaping from flexible, optically integrated organic light-emitting diodes, Applied Physics Letters, vol. 88, 153514 (2006), P. Melpignano, pp. 1-3.

Improved light out-coupling in organic light emitting diodes employing ordered microlens arrays, Journal of Applied Physics, vol. 91, No. 5, Mar. 1, 2002, S. Moller, pp. 3324-3327.

Using holography to increase the light output efficiency of an organic light-emitting diode-angular, wavelength, and near-field effects, Optical Engineering, vol. 44 (11), 111306 (Nov. 2005), Hua-Kuang Liu, pp. 1-9.

A nano-patterned organic light-emitting diode with high extraction efficiency, Journal of Crystal Growth 288 (2006), Benzhong Wang, pp. 119-122.

A high-extraction-efficiency nanopatterned organic light-emitting diode, Applied Physics Letters, vol. 82, No. 21, May 26, 2003, Yong-Jae Lee, pp. 3779-3781.

Nanopattern-Assisted Growth of Organic Materials for Device Applications, D. Mascaro.

Imprinting technique offers low-cost photonic crystal LEDS, Compound Semiconductor, Oct. 2006, Rob Hershey.

Modification of polymer light emission by lateral microstructure, Synthetic Metals 116 (2001), A.N. Safonov, pp. 145-148.

Enhanced out-coupling factor of microcavity organic light-emitting devices with irregular microlens array, Optics Express, vol. 14, No. 14, Jul. 10, 2006, Jongsun Lim, pp. 6564-6571.

Measuring the refractive indices of conjugated polymer films with Bragg grating outcouplers, Applied Physics Letters, vol. 83, No. 24, Dec. 15, 2003, Jonathan M. Ziebarth, pp. 5092-5094.

Improving the light extraction efficiency of red-emitting conjugated polymer light emitting diodes, Journal of Applied Physics 99, 054505 (2006), Ali M. Adawi, pp. 1-8.

Grating micro-dot patterned light guide plates for LED backlights, Optics Express, vol. 15, No. 6, Mar. 19, 2007, Seung Ryong Park, pp. 2888-2899.

Effects of the artificial Ga-nitride/air periodic nanostructures on current injected GaN-based light emitters, Phys. Stat. Sol., vol. 2, No. 7 (2005) Bei Zhang, pp. 2858-2861.

GaInN light-emitting diode with conductive omnidirectional reflector having a low-refractive-index indium-tin oxide layer, Applied Physics Letters, vol. 88, 013501 (2006), Jong Kyu Kim, pp. 1-3.

Photonic Crystal-Assisted Light Extraction from a Colloidal Quantum Dot/GaN Hybrid Structure, Nano Letters, vol. 6, No. 6, 2006, Frederic S. Diana, pp. 1116-1120.

Enhanced coupling of light from organic light emitting diodes using nanoporous films, Journal of Applied Physics, vol. 96, No. 3, Aug. 1, 2004, H. J. Peng, pp. 1649-1654.

Extraction of light from sources located inside waveguide grating structures, Optics Letters, vol. 24, No. 3, Feb. 1, 1999, H. Rigneault, pp. 148-150.

Enhancement of light extraction from a silicon quantum dot light-emitting diode containing a rugged surface pattern, Applied Physics Letters, vol. 89, 191120 (2006), Kyung-Hyun Kim, pp. 1-3.

Extracting Light from Polymer Light-Emitting Diodes Using Stamped Bragg Gratings, Advanced Functional Materials, vol. 14, No. 5, May 2004, Jonathan M Ziebarth, pp. 451-456.

Experimental demonstration of increased organic light emitting device output via volumetric light scattering, Journal of Applied Physics, vol. 95, No. 5, Mar. 1, 2004, J.J. Shiang, pp. 2889-2895.

Light Extraction from OLEDs Using Volumetric Light Scattering, GE Global Research, Class 1, Dec. 2003, Joseph Shiang.

Overview of fundamentals and applications of electrons, excitons and photons in confined structures, Journal of Luminescence, vol. 85 (2000), C. Weisbuch, pp. 271-293.

Efficiency enhancement of microcavity organic light emitting diodes, Applied Physics Letters, vol. 69, No. 14, Sep. 30, 1996, R. H. Jordan, pp. 1997-1999.

Electroluminescence emission pattern of organic light-emitting diodes: Implications for device efficiency calculations, Journal of Applied Physics, vol. 88, No. 2, Jul. 15, 2000, Ji-Seon Kim, pp. 1073-1081.

Enhanced light emission from an organic photonic crystal with a nanocavity, Applied Physics Letters, vol. 87, 151119 (2005), M. Kitamura, pp. 1-3.

High-efficiency top-emitting organic light-emitting devices, Applied Physics Letters, vol. 81, No. 21, Nov. 18, 2002, M. H. Lu, pp. 3921-3923.

Enhanced efficiency of GaN-based light-emitting diodes with periodic textured Ga-doped ZnO transparent contact layer, Applied Physics Letters, vol. 90, 263511 (2007), Jinn-Kong Sheu, pp. 1-3.

Sharply directed emission in organic electroluminescent diodes with an optical-microcavity structure, Applied Physics Letters, vol. 65 (15), Oct. 10, 1994, Tetsuo Tsutsui, pp. 1868-1870.

Material challenge for flexible organic devices, Materials Today, vol. 9, No. 4, Apr. 2006, Jay Lewis, pp. 38-45.

Efficient Optical Evaluations of Incoherent Film Stacks, 2004, David G. Freier.

Light outcoupling efficiency of top-emitting organic light-emitting diodes, Applied Physics Letters, vol. 84, No. 16, Apr. 19, 2004, L. H. Smith, pp. 2986-2988.

Reduction of operating voltage in organic light-emitting diode by corrugated photonic crystal structure, Applied Physics Letters, vol. 85, No. 23, Dec. 6, 2004, Masayuki Fujita, pp. 5769-5771.

Broadband diffraction management and self-collimation of white light in photonic lattices, Physical Review, vol. 74, 066609 (2006), Ivan L. Garanovich, pp. 1-4.

Bragg scattering from periodically microstructured light emitting diodes, Applied Physics Letters, vol. 77, No. 21, Nov. 20, 2000, John M. Lupton, pp. 3340-3342.

Improvement of output coupling efficiency of organic light-emitting diodes by backside substrate modification, Applied Physics Letters, vol. 76, No. 13, Mar. 27, 2000, C.F. Madigan, pp. 1650-1652.

Emission properties of an organic light-emitting diode patterned by a photoinduced autostructuration process, Applied Physics Letters, vol. 87, 191105 (2005), C. Hubert, pp. 1-3.

Exit Surface Microstructure Enhanced OLEDs, Dec. 12, 2003, T. R. Hoffend Jr.

Numerical Investigation of a 2D-Grating for Light Extraction of a Bottom Emitting OLED, Icton 2006, Peter Vandersteegen, pp. 211-214.

Enhanced Light Extraction from Organic Light-Emitting Diodes with 2D-SiO2/SiNx Photonic Crystals, Advanced Materials, vol. 15, No. 14, Jul. 17, 2003, Young Rag Do, pp. 1214-1218.

Two-dimensional photonic crystals constructed with a portion of photonic quasicrystals, Optics Express, vol. 15, No. 10, May 14, 2007, Yi Yang, pp. 5991-5996.

Enhanced Luminance Efficiency of Organic Light-Emitting Diodes with Two-Dimensional Photonic Crystals, Japan Society of Applied Physics, vol. 44, No. 4B, 2005, Masatoshi Kitamura, pp. 2844-2848.

Organic light emitting devices with enhanced outcoupling via microlenses fabricated by imprint lithography, Journal of Applied Physics, vol. 100, 073106 (2006), Yiru Sun, pp. 1-6.

A. Chwang et al., "Full Color 100 dpi AMOLED Displays on Flexible Stainless Steel Substrates," SID 06 Digest, pp. 1858-1861 (2006).

A. Kosiorek, et al. Shadow Nanosphere Lithography: Simulation and Experiment, Nano Lett, vol. 4, No. 7, p. 1359-1363 (2004).

C. Yang, et al., Group Contribution to Molar Refraction and Refractive Index of Conjugated Polymers, Chem. Mater. 7, 1276 (1995).

C.L. Haynes, et al., Nanosphere Lithography: A Versatile Nonofabrication Tool for Studies of Size-Dependent Nanoparticle Optics, J. Phys. Chem. B 105 (2001) 5599.

C.Y. Lin et al., Low Blur Effect and High Light Extraction Efficiency Enhancement of Organic Light Emitting Displays with Novel Microstructure Attachment, SID Symposium Digest, vol. 38, Issue 1, p. 867-870, May 2007.

D.U. Jin et al., "5.6-inch Flexible Full Color Top Emission AMOLED Display on Stainless Steel Foil," SID 06 Digest, pp. 1855-1857 (2006).

F. Schuurmans, et al., Strongly Photonic Macroporous Gallium Phosphide Networks Science vol. 284, pp. 141-143 Apr. 1999.

H. Ichikawa, Appl. Phys. Letters V. 84, p. 457 (2004).

H.W. Deckman, et al., Natural Lithography, Appl. Phys. Lett. 41 (1982) 377.

I. Schnitzer, et al., Ultrahigh Spontaneous Emission Quantum Efficiency, 99.7% Internally and 72% Externally, Appl. Phys. Lett. 62 p. 131 (1993).

K. Chari et al. Eastman Kodak Company, SID conference May 20-25, 2007 "Enhanced Outcoupling of Light from Organic Light Emitting Diodes by Microlens Arrays Based on Breath-Figure Template".

K. Neyts, Microcavity effects and the outcoupling of light in displays and lighting applications based on thin emitting films, Applied Surface Science 244, p. 517-523 (2005).

M. Bardosova, et al., Synthetic opals made by the Langmuir-Blodgett method, Thin Solid Films 437 276-279 (2003).

M. Holgado, et al., Electrophoretic Deposition to Control Artificial Opal Growth, Langmuir 15 4701-4704 (1999).

J. Song, et al., Preparation of water depersed indium tin oxide sol solution, Molecular Crystals and Liquid Crystals, 444 (2006) 247-255.

R. Bathelt et al., Light extraction from OLED for light applications through light scattering, Organic Electronics, 8 (2007) 293.

Proceedings of SPIE, vol. 5519, p. 194, 2004 "Sub-wavelengthparticle layer for improved light out-coupling of OLADs".

R. Burzynski, et al., Large optical birefringence in poly(p-phenylene vinylene) films measured by optical maveguide techniques, Polymer 31, 627-630 (1990).

D. Raimundo et al., Self-assembled systems obtained by chemical and electrochemical techniques for photonic crystal fabrication, Microelectronics Journal 36, pp. 207-211 (2005).

S. Fan, High Extraction Effieciency of Spontaneous Emission from Slabs of Photonic Crystals, Phys. Rev. Letters v. 78, No. 17, p. 3294-3297 (1997).

Y.C. Kim, et al., Planarized SiNx/spin-on-glass photonic crystal organic light-emitting diodes, Appl.Phys.Lett. 89, 173502 (2006).

Banerjee et al., "Size-dependent optical properties of sputter-deposited nanocrystalline p-type transparent $CuAlO_2$ thin films", Journal of Applied Physics, vol. 97, 2005, pp. 084308-1 to 084308-8.

Hakim et al., "Conformal Coating of Nanoparticles Using Atomic Layer Deposition in a Fluidized Bed Reactor", Prepared for presentation at the 2004 AIChE Annual Meeting, Austin, 21 pages.

Ahn et al, "Self-assembled particle monolayers on polyelectrolyte multilayers: particle size effects on formation, structure, and optical properties", Colloids and Surfaces A: Physiochem. Eng. Aspects 259 (2005), pp. 45-53.

* cited by examiner

LIGHT EXTRACTION FILM FOR ORGANIC LIGHT EMITTING DIODE DISPLAY AND LIGHTING DEVICES

REFERENCE TO RELATED APPLICATION

The present application is related to U.S. Patent Application Publication No. 2009/0015142, which is incorporated herein by reference.

BACKGROUND

Organic Light Emitting Diodes (OLEDs) are the basis for a new display and lighting technology, providing a good match for high resolution or high pixel count high definition display applications, and for efficient, broad area, flexible lighting applications. OLED devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

In OLED devices, over 70% of the generated light is typically lost due to processes within the device structure. The trapping of light at the interfaces between the higher index organic and Indium Tin Oxide (ITO) layers and the lower index substrate layers is the major cause of this poor extraction efficiency. Only a relatively small amount of the emitted light emerges through the transparent electrode as "useful" light. The majority of the light undergoes internal reflections, which result in its being emitted from the edge of the device or trapped within the device and eventually being lost to absorption within the device after making repeated passes.

Efforts have been made to improve the internal quantum efficiency (number of photons generated per electron injected) of OLEDs by means such as modifying the charge injection or transport layers, using fluorescent dyes or phosphorescent materials, or by using multilayer structures (see, for example, K. Meerholz, Adv. Funct. Materials v. 11, no. 4, p 251 (2001)). Light extraction efficiency (number of photons emerging from the structure vs. the number generated internally) can be influenced by factors external to the emission layers themselves.

A bottom emitting OLED may be thought of as consisting of a core containing high index of refraction layers (organic layers for light generation, carrier transport, injection or blocking, and, typically, a transparent conductive oxide layer) and a low index of refraction substrate material (typically glass, but could be a polymer film). Therefore light that is generated within the core may encounter two high-index to low-index interfaces where it might undergo internal reflection. Light unable to escape the core as a result of encounter at the first interface is confined to a waveguide mode, while light passing through that interface but unable to escape from the substrate as a result of reflection at the substrate-to-air interface is confined to a substrate mode. Similar optical losses occur due to interfaces in top emitting OLEDs.

Various solutions have been proposed to affect light reaching the substrate-to-air interface by disturbing that interface (e.g., microlenses or roughened surfaces). Others have introduced scattering elements into the substrate or into an adhesive (see Published PCT Application No. WO2002037580A1 (Chou)), thereby interrupting the substrate modes to redirect that light out of the device. There have even been some preliminary attempts to disturb the core-to-substrate interface by introducing scattering or diffractive elements at this interface. Detailed analysis has shown that scattering or diffracting structures will be most effective in extraction light when located at this interface (M. Fujita, et al.; Jpn. J. Appl. Phys. 44 (6A), pp. 3669-77 (2005)). Scattering efficiency is maximized when the index contrast between the scattering or diffractive elements and the backfill material is large and when the length scale of the index contrast variations is comparable to the wavelength of the light (see, for example, F. J. P. Schuurmans, et al.; Science 284 (5411), pp. 141-143 (1999)).

Fabrication of defect-free OLED devices in contact with this light extracting layer will require a smooth planar surface, so planarity of the top surface of a light extraction film is important. There has been, however, some work on corrugating the electrode structure in order to couple light out of the OLED (M. Fujita, et al.; Jpn. J. Appl. Phys. 44 (6A), pp. 3669-77 (2005)); the resultant effects on the electric fields in the device are expected to have deleterious effects. So great care must be taken to not adversely affect the electrical operation of the device while disturbing this interface. Practical solutions to balancing these conflicting issues have not yet been proposed.

Similar problems in external efficiency exist with inorganic light-emitting diodes (LEDs), where the very high refractive indices of the active materials can severely limit the extraction of internally generated light. In these cases, there have been some attempts to utilize photonic crystal (PC) materials to improve the extraction efficiency (S. Fan, Phys. Rev. Letters v. 78, no. 17, p. 3294 (1997); H. Ichikawa, Appl. Phys. Letters V. 84, p. 457 (2004)). Similar reports on the use of PCs in connection with OLED efficiency improvement have begun to appear (M. Fujita, Appl. Phys. Letters v. 85, p. 5769 (2004); Y. Lee, Appl. Phys. Letters v. 82, p. 3779 (2003)), but previously reported results have involved time-consuming and costly procedures which do not lend themselves incorporation into existing OLED fabrication processes.

Accordingly, a need exists for a product which can enhance light extraction from OLED devices in a form which is compatible with fabrication processes for these devices.

SUMMARY

A multifunctional optical film for enhancing light extraction in a self-emissive lighting device, consistent with the present invention, includes a flexible substrate, a structured layer, and a backfill layer. The structured layer of extraction elements has a first index of refraction, and a substantial portion of the extraction elements are within an evanescent zone adjacent to a light emitting region of a self-emissive light source when the optical film is located against the self-emissive light source. The backfill layer has a material having a second index of refraction different from the first index of refraction, and the backfill layer forms a planarizing layer over the extraction elements. The film may optionally have additional layers added to or incorporated within it to effect additional functionalities beyond improvement of light extraction efficiency; these additional functionalities may include mechanical support, barrier protection, electrical conductance, spectral modification, or polarization.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Figure 1:
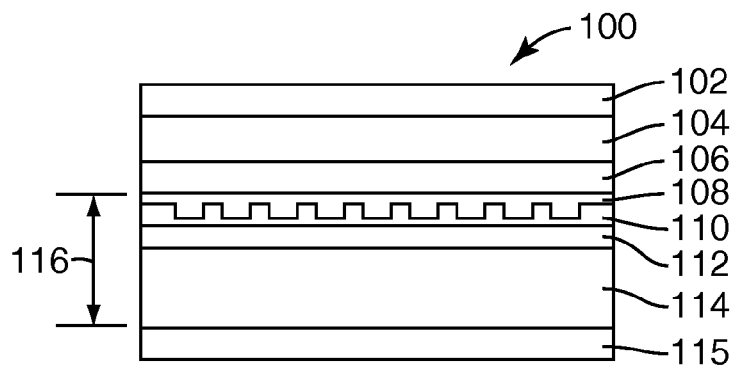
FIG. 1 is a diagram of a bottom emitting OLED display device with a light extraction film.

Embodiments include methods to form light-extracting nanostructures, or other nanostructures, in a polymer replication process, a direct deposition of nanoparticles, or other processes to make a light extraction film for OLED devices. The multifunctional film product can, in addition to enhancing light extraction, serve additional functions such as a substrate, encapsulant, barrier layer, filter, polarizer, or color converter and may be employed either during or after manufacture of an OLED device. The film construction is based upon photonic crystal structures, or other nanostructures, for improved efficiency of light extraction from the devices by modifying the interface between high and low index layers within the device.

Elements of the invention include the provision of structures of dimensions comparable to or less than the wavelength of the light to be controlled, the provision of a material with contrasting index of refraction to fill in the areas surrounding the structures and also to planarize the structure in order to present an essentially smooth surface to come in contact with the OLED structure, and the location of this index-contrasting nanostructured layer within a small enough distance from the light-emitting region to be effective in extracting the light that would otherwise be trapped in that region.

Light incident from a high-index material onto an interface with a lower index medium will undergo total internal reflection (TIR) for all incidence angles greater than the critical angle $\theta_C$, defined by $\theta_C = \sin^{-1}(n_2/n_1)$, where $n_1$ and $n_2$ are the refractive indices of the high- and low-index regions, respectively. The electromagnetic field associated with this light reflected by TIR extends into the lower-index region in an evanescent standing wave, but the strength of this field diminishes exponentially with distance from the interface. Absorbing or scattering entities located within this evanescent zone, typically about one wavelength thick, can disrupt the TIR and cause the light to pass through the interface. Therefore, it is preferable that the nanostructured index contrast layer be located within the evanescent zone if it is to be most effective in causing extraction of the light from the emission region by scattering or diffraction.

Replication master tools can be fabricated with regular or random structures of the required average periodicity for light extraction, 200 nanometers (nm)—2000 nm, over increasingly larger areas. Combining this tooling capability with microreplication processes such as continuous cast and cure (3C) enable the formation of the photonic crystal structures, or other nanostructures, on the surface of a film substrate. Examples of a 3C process are described in the following patents, all of which are incorporated herein by reference: U.S. Pat. Nos. 4,374,077; 4,576,850; 5,175,030; 5,271,968; 5,558,740; and 5,995,690.

The terms "nanostructure" or "nanostructures" refers to structures having at least one dimension (e.g., height, length, width, or diameter) of less than 2 microns and more preferably less than one micron. Nanostructure includes, but is not necessarily limited to, particles and engineered features. The particles and engineered features can have, for example, a regular or irregular shape. Such particles are also referred to as nanoparticles.

The term "nanostructured" refers to a material or layer having nanostructures.

The term "photonic crystal structures" refers to periodic or quasi-periodic optical nanostructures interspersed with a material of sufficiently different index of refraction that will enable the structure to produce gaps in the spectrum of allowed electromagnetic modes in the material.

The term "index" refers to the index of refraction.

The term "backfill" refers to the material incorporated into a structure, and of a different index from the structure, to fill in voids in the structure and planarize the structure.

The term "extraction elements" refers to any type and arrangement of nanostructures enhancing light extraction from self-emissive light sources. The extraction elements are preferably not contained within a volume distribution.

Bottom Emitting OLED Display Device

FIG. 1 illustrates a structure of bottom emitting OLED device 100 with a film substrate having a light extraction film. A bottom emitting OLED device is defined as an OLED device emitting light through the substrate. Table 1 describes the exemplary elements of device 100 and the arrangement of those elements, as identified by the reference numbers provided in FIG. 1. Each layer of device 100 can be coated on or otherwise applied to the underlying layer.

TABLE 1

Bottom Emitting OLED Device with Light Extraction Film

| Ref. No. | Type of Element |
| --- | --- |
| 102 | electrode 1 |
| 104 | organic layers |
| 106 | electrode 2 |
| 108 | high index structure |
| 110 | low index structure |
| 112 | optional barrier layer |
| 114 | substrate |
| 115 | optional functional layers |
| 116 | light extraction film |

The substrate 114 is composed of a material, substantially transparent (transmissive) to the desired emitted wavelengths, that provides sufficient mechanical support and thermal stability for the device. Substrate 114 preferably comprises a flexible material. Examples of substrate materials include the following: glass; flexible glass; polyethylene terephthalate ("PET"); polyethylene naphthalate ("PEN"); or other translucent or transparent materials. Substrate 114 can optionally also function as a barrier layer. Also, substrate 114 can optionally contain dyes or particles, and it can be tentered or include prismatic structures.

The optional barrier layer 112 effectively blocks or helps prevent permeation of oxygen and water to the layers of the device, particularly the organic layers. Examples of barrier layers are described in U.S. Patent Application Publication Nos. 2006/0063015 (describing boron oxide layers with inorganic barrier layers) and 2007/0020451 (describing diamond-like glass (DLG) and diamond-like carbon (DLC)), both of which are incorporated herein by reference.

The electrodes 102 and 106 can be implemented with, for example, transparent conductive oxide (TCO) such as indium tin oxide (ITO) or metals with the appropriate work function to make injection of charge carriers such as calcium, aluminum, gold, or silver.

The organic layers 104 can be implemented with any organic electroluminescent material such as a light-emitting polymer, an example of which is described in U.S. Pat. No. 6,605,483, which is incorporated herein by reference. Other examples of suitable light emitting materials include evaporated small molecule materials, light-emitting dendrimers, molecularly doped polymers, and light-emitting electrochemical cells.

The light extraction film 116 in this embodiment is composed of substrate 114, optional barrier layer 112, low index structure 110, and high index structure 108. The high index structure uses a backfill medium to effectively provide a planarizing layer over the low index structure in order to make the light extraction film sufficiently planar to allow OLED fabrication. The backfill layer can alternatively have other optical properties. Also, the backfill layer material can function as a barrier to moisture and oxygen or provide electrical conduction, possibly in addition to having barrier properties, depending upon the type of material used. The backfill layer can alternatively be implemented with an optically clear adhesive, in which case the extraction film can be applied to top emitting OLED device, for example.

The low index structure 110 has a material with an index substantially matched to the underlying layer, typically the substrate. The low index structure 110 is composed of a nanostructured layer, which can have a periodic, quasi-periodic, or random distribution or pattern of optical nanostructures, including photonic crystal structures. It can include discrete nanoparticles. The nanoparticles can be composed of organic materials or other materials, and they can have any particle shape. The nanoparticles can alternatively be implemented with porous particles. The distribution of nanostructures can also have varying pitches and feature size. At least a portion of the extraction elements or nanostructures are preferably in contact with the flexible substrate, and the extraction elements may have voids beneath them. The layer of nanoparticles can be implemented with nanoparticles in a monolayer or with a layer having agglomerations of nanoparticles.

Using a thickness of the nanostructures on the order of the evanescent wave from the organic layers can result in coupling of the evanescent wave to the nanostructures for extraction of additional light from the device. This coupling preferably occurs when the light extraction film is adjacent to the light emitting region of the self-emissive light source. When the backfill layer has a lower index than the structured layer, then the backfill layer preferably has a thickness substantially equal to the extraction elements. When the backfill layer has a higher index than the structured layer, then the backfill layer can be thicker than the extraction elements provided it can still interact with the evanescent wave. In either case, the structured layer and backfill layer are preferably in sufficient proximity to the light output surface in order to at least partially effect the extraction of light from that surface.

The nanostructured features in layer 110 can be fabricated using any printing techniques for replication of submicron features such as the following: imprinting; embossing; nanoimprinting; thermal- or photo-nanoimprint lithography; injection molding; or nanotransfer printing. Another technique for fabricating the extraction elements is described in Example 18 in U.S. Pat. No. 6,217,984, which is incorporated herein by reference.

The high index structure 108 is a high index material providing index contrast to the adjacent low index nanostructured layer and provides an effective planarization layer to it. The index of refraction mismatch between nanostructured layer 110 and backfill medium 108 at the emission wavelength(s) is referred to as $\Delta n$, and a greater value of $\Delta n$ generally provides better light extraction. The value of $\Delta n$ is preferably greater than or equal to 0.3, 0.4, 0.5, or 1.0. Any index mismatch between the extraction elements and backfill medium will provide for light extraction; however, a greater mismatch tends to provide greater light extraction and is thus preferred. Examples of suitable materials for backfill medium 108 include the following: high index inorganic materials; high index organic materials; a nanoparticle filled polymer material; silicon nitride; polymers filled with high index inorganic materials; and high-index conjugated polymers. Examples of high-index polymers and monomers are described in C. Yang, et al., Chem. Mater. 7, 1276 (1995), and R. Burzynski, et al., Polymer 31, 627 (1990) and U.S. Pat. No. 6,005,137, all of which are incorporated herein by reference. Examples of polymers filled with high index inorganic materials are described in U.S. Pat. No. 6,329,058, which is incorporated herein by reference. The backfill layer can be applied to form the planarizing layer using, for example, one of the following methods: liquid coating; vapor coating; powder coating; or lamination.

Functionality can be added to the construction by depositing on it a transparent conductor such as ITO ($n \approx 1.9$-$2.1$) with high index, high transparency and low sheet resistivity, to serve as the anode for the OLED device. The ITO can even be used as the backfill for the structure, if the layer can fill the structures and form into a smooth layer without adverse effects on the optical or electrical properties. Alternatively, after backfilling and smoothing, alternating metallic and organic layers may be deposited to form a transparent conductive overlayer in the manner as described in U.S. Patent Application Publication No. 2004/0033369, which is incorporated herein by reference.

Additional flexibility in the functionality of the extractor pattern of the photonic crystal structures or nanostructures can be obtained through the use of photonic quasicrystal structures. These quasicrystal structures are designed using tiling rules; they have neither true periodicity nor translation symmetry but have a quasi-periodicity with long-range order and orientation symmetry, examples of which are described in the following reference, which is incorporated herein by reference: B. Zhang et al., "Effects of the Artificial Ga-Nitride/Air Periodic Nanostructures on Current Injected GaN-Based Light Emitters," Phys. Stat. Sol.(c) 2(7), 2858-61 (2005). The photonic quasicrystal structures offer the possibility of a pseudogap for all propagation directions, and they exhibit unique light scattering behaviors. In particular, these patterns of quasiphotonic crystal structures can eliminate artifacts resulting from the regularity of conventional photonic crystal structures, and they can be used to tailor unique light emission profiles and possibly can eliminate undesirable chromatic effects when working with broadband OLED emitters. Photonic crystal structures are described in the following patents, all of which are incorporated herein by reference: U.S. Pat. Nos. 6,640,034; 6,901,194; 6,778,746; 6,888,994; 6,775,448; and 6,959,127.

Embodiments can involve the incorporation of the diffractive or scattering nanostructures into a film product which could be continuously produced, for example, on a web line having a polymer film or ultrabarrier coated film substrate fed to a 3C replication process followed by deposition of a high index backfill medium. Alternate ways to incorporate the diffractive or scattering nanoparticles into the film include solution coating a dispersion of particles. This film can be designed to be used directly as the substrate on which a bottom emitting OLED is fabricated, enabling the production of a film capable of many uses in addition to enhancing light extraction.

Additional functionality could be incorporated into the light extraction film product by forming the extraction structures on an optional ultrabarrier film, which provides excellent moisture and oxygen barrier properties. Ultrabarrier films include multilayer films made, for example, by vacuum deposition of two inorganic dielectric materials sequentially in a multitude of layers on a glass or other suitable substrate, or alternating layers of inorganic materials and organic polymers, as described in U.S. Pat. Nos. 5,440,446; 5,877,895; and 6,010,751, all of which are incorporated herein by reference.

Materials may also be incorporated within the film to enhance light extraction through scattering or to filter, color shift, or polarize the light. Finally, surface coatings or structures, for example functional layers 115, can be applied to the air surface of the light extraction film in order to further increase the functionality and possibly value of a light extraction film. Such surface coatings can have, for example, optical, mechanical, chemical, or electrical functions. Examples of such coatings or structures include those having the following functions or properties: antifog; antistatic; antiglare; antireflection; antiabrasion (scratch resistance); antismudge; hydrophobic; hydrophilic; adhesion promotion; refractive elements; color filtering; ultraviolet (UV) filtering; spectral filtering; color shifting; color modification; polarization modification (linear or circular); light redirection; diffusion; or optical rotation. Other possible layers to be applied to the air surface include a barrier layer or a transparent electrically conductive material.

Top Emitting OLED Display Device

Figure 2:
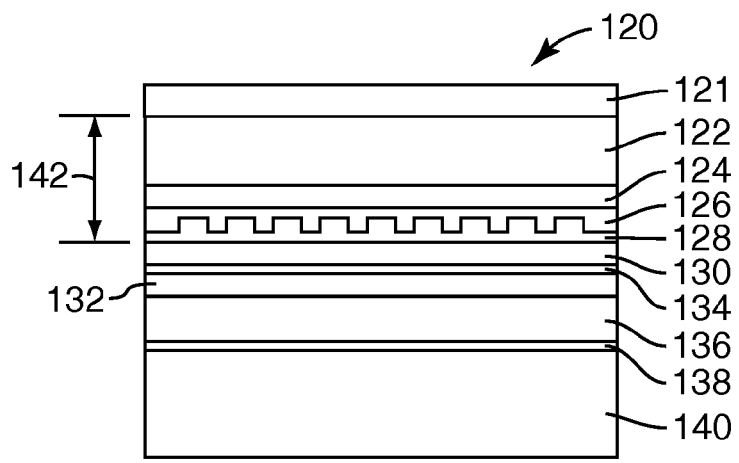
FIG. 2 is a diagram of a top emitting OLED display device with a light extraction film.

FIG. 2 illustrates a structure of top emitting OLED device 120 with a film substrate having a light extraction film. Table 2 describes the exemplary elements of the device 120 and the arrangement of those elements, as identified by the reference numbers provided in FIG. 2. Each layer of the device can be coated on or otherwise applied to the underlying layer. The configurations shown in FIGS. 1 and 2 are provided for illustrative purposes only, and other configurations of bottom emitting and top emitting OLED display devices are possible.

TABLE 2

Top Emitting OLED Device with Light Extraction Film

| Ref. No. | Type of Element |
|---|---|
| 121 | optional functional layers |
| 122 | substrate 1 |
| 124 | optional barrier layer |
| 126 | low index structure |
| 128 | high index structure |
| 130 | optical coupling layer |
| 132 | electrode 1 |
| 134 | optional thin film encapsulant layer |
| 136 | organic layers |
| 138 | electrode 2 |
| 140 | substrate 2 |
| 142 | light extraction film |

The light extraction film 142 in this embodiment is composed of substrate 122, optional barrier layer 124, low index structure 126, and high index structure 128. Low index structure 126 and high index structure 128 can be implemented with the exemplary materials and constructions described above. Layers 128 and 130 can optionally be implemented with a single layer. The substrates 122 and 140, optional barrier layer 124, electrodes 132 and 138, and organic layers 136 can be implemented with the exemplary materials identified above.

Optional thin film encapsulant 134 can be implemented with, for example, any suitable material for protecting the organic layers from moisture and oxygen. Examples of encapsulants for OLED devices are described in U.S. Pat. No. 5,952,778 and U.S. patent application Ser. No. 11/424,997, filed Jun. 19, 2006, both of which are incorporated herein by reference.

OLED devices, especially top emitting OLED devices as shown in FIG. 2, are optionally completed by depositing a thin film encapsulant, typically on a semitransparent electrode. This construction of an OLED device provides an advantage; in particular it creates access to the critical high index device-air interface after the completion of device fabrication, enabling a lamination process for the application of the light extraction film. For top emitting OLED devices, embodiments include a light extraction film as described above for bottom emitting OLED devices. Alternatively, the film can be designed to be the capping layer on a top emitting OLED structure when combined with a suitable high index adhesive to serve as the optical layer 130 in order to optically couple the OLED device to the light-extracting layer. The encapsulant material may itself serve as the index contrast material which backfills the nanostructures to form the light extraction layer.

OLED Solid State Lighting Element

Top emitting OLED device 120 or bottom emitting OLED device 100 can also be used to implement an OLED solid state lighting element. In addition to the substrates identified above, examples of substrates useful in top emitting OLED solid state lighting devices, including flexible metal foils, are described in the following papers, all of which are incorporated herein by reference: D. U. Jin et al., "5.6-inch Flexible Full Color Top Emission AMOLED Display on Stainless Steel Foil," SID 06 DIGEST, pp. 1855-1857 (2006); and A. Chwang et al., "Full Color 100 dpi AMOLED Displays on Flexible Stainless Steel Substrates," SID 06 DIGEST, pp. 1858-1861 (2006).

Figure 3:
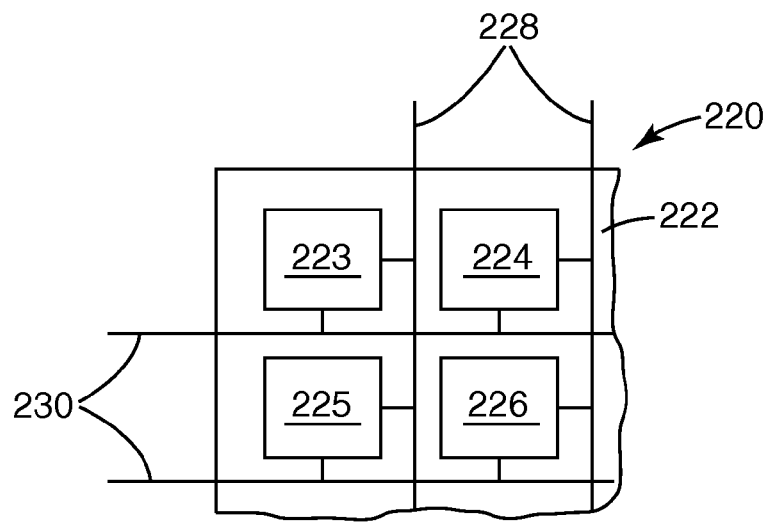
FIG. 3 is a diagram illustrating spatially modulated OLEDs for a solid state lighting element.

FIG. 3 is a diagram illustrating a device 220 having spatially modulated OLED devices for use in solid state lighting devices. Device 220 includes a substrate 222 supporting a plurality of OLED devices 223, 224, 225, and 226, each of which may correspond with the structures described above with respect to bottom or top emitting OLED display devices. Each of the OLED devices 223-226 can be individually controlled as represented by lines 228 and 230, which would provide electrical connections to the anodes and cathodes in devices 223-226. Device 220 can include any number of OLED devices 223-226 with electrical connections, and substrate 222 can be scaled to accommodate them. The individual control of devices 223-226, via connections 228 and 230, can provide for spatial modulation of them such that they are individually or in groups lighted in a particular sequence or pattern. Device 220 can be used in solid state light, for example, on a rigid or flexible substrate 222.

OLED Backlight Unit

Figure 4:
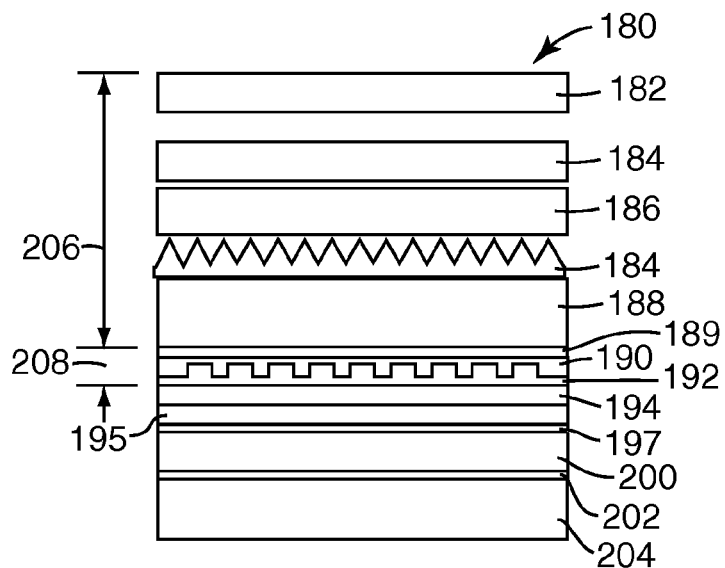
FIG. 4 is a diagram of an OLED backlight unit with a light extraction film.

FIG. 4 is a diagram of a top emitting OLED backlight unit 180 with light extraction film. Table 3 describes the exemplary elements of the backlight unit 180 and the arrangement of those elements, as identified by the reference numbers provided in FIG. 4. Each layer of backlight unit 180 can be coated on or otherwise applied to the underlying layer. Alternatively, bottom emitting OLEDs can also be used for backlight units.

TABLE 3

OLED Backlight Unit with Light Extraction Film

| Ref. No. | Type of Element |
|---|---|
| 182 | polarizer |
| 184 | optional prism layer |
| 186 | optional asymmetric reflective film |
| 188 | optional diffuser |
| 189 | substrate 1 |
| 190 | low index structure |
| 192 | high index structure |
| 194 | optical coupling layer |
| 195 | optional thin film encapsulant layer |
| 197 | electrode 1 |
| 200 | organic layers |
| 202 | electrode 2 |
| 204 | substrate 2 |
| 206 | auxiliary optical films |
| 208 | light extraction film |

The light extraction film 208 in this embodiment is composed of optional prism layer 184, optional diffuser 188, low index structure 190, and high index structure 192. Low index structure 190 and high index structure 192 can be implemented with the exemplary materials and constructions described above. The other elements of this embodiment, as provided in Table 3, can be implemented with the exemplary materials identified above. Layers 192 and 194 can alternatively be implemented with a single layer.

Figure 5:
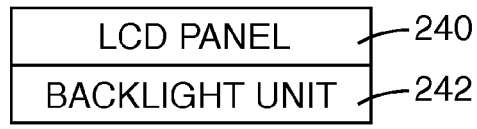
FIG. 5 is a diagram illustrating OLEDs used as an LCD backlight unit.

FIG. 5 is a diagram illustrating OLED devices used as a liquid crystal display (LCD) backlight unit 242 for an LCD panel 240. Backlight unit 242 may correspond with the structure 180. The backlight unit 242 can alternatively be implemented with the spatially modulated light panel shown in FIG. 3. LCD panel 240 typically includes the entire LCD device except the backlight and drive electronics. For example, LCD panel 240 typically includes the backplane (subpixel electrodes), front and back plates, liquid crystal layer, color filter layer, polarizing filters, and possibly other types of films. Use of OLED devices as a backlight may provide for a thin, low power backlight for LCDs. An example of LCD panel components and a backlight unit are described in U.S. Pat. No. 6,857,759, which is incorporated herein by reference.

High Index/Low Index Regions and Surface Configurations

Figure 6:
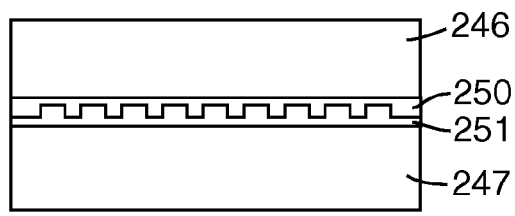
FIGS. 6-9 are diagrams depicting possible spatial configurations of extraction elements.
Figure 7:
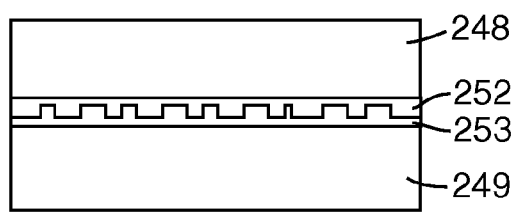

FIGS. 6-9 are diagrams depicting the possible spatial configurations of extraction elements. FIG. 6 illustrates a low index structure 250, having a regular pattern of nanostructures, with a high index structure 251 providing a planarizing layer over the nanostructures. The structures 250 and 251 are located between a low index substrate 246 and an OLED device region 247. FIG. 7 illustrates a low index structure 252, having an irregular pattern of nanostructures, with a high index structure 253 providing a planarizing layer over the nanostructures. The structures 252 and 253 are located between a low index substrate 248 and an OLED device region 249. In FIGS. 6 and 7, the low and high index structures are located between a substrate and an OLED device (light emitting) region.

Figure 8:
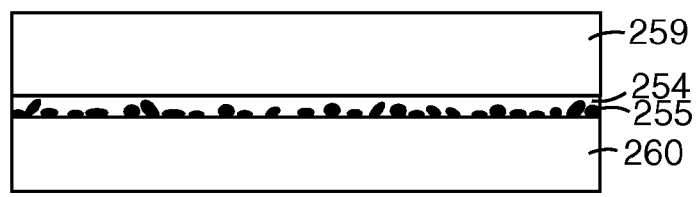
Figure 9:
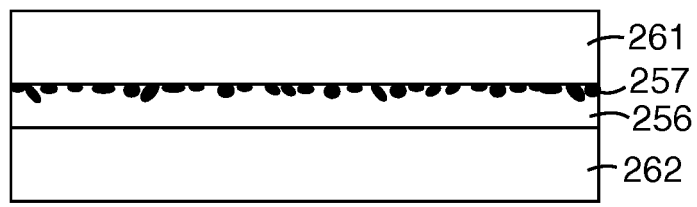

FIG. 8 illustrates high index extraction elements 255 within a low index backfill region 254 with the low index region 254 providing the planarizing layer. The extraction elements 255 and backfill 254 are located between a low index substrate 260 and an OLED device region 259. FIG. 9 illustrates low index extraction elements 257 within a high index backfill region 256 with the high index region 256 providing the planarizing layer. The extraction elements 257 and backfill 256 are located between a low index substrate 261 and an OLED device region 262. In the embodiments shown in FIGS. 8 and 9, the extraction elements are concentrated in the evanescent zone. The layers shown in FIGS. 6-9 illustrate patterns and interfaces of the low index and high index structures described above.

Figure 10:
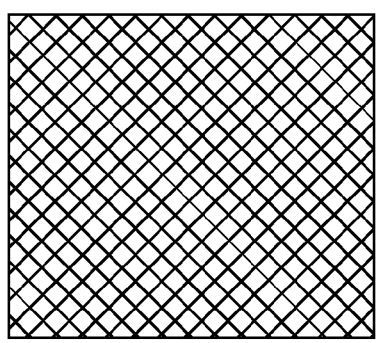
FIGS. 10-14 are diagrams depicting possible surface configurations of extraction elements.
Figure 11:
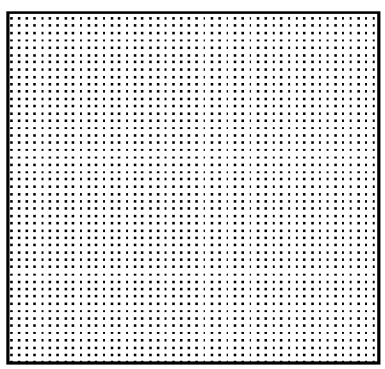
Figure 12:
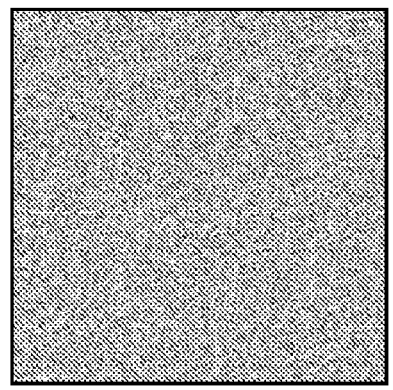
Figure 13:
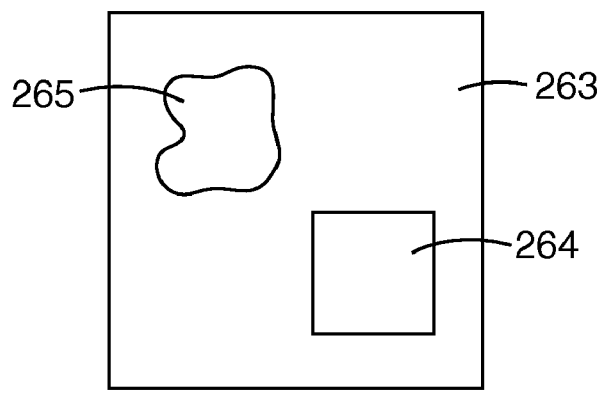
Figure 14:
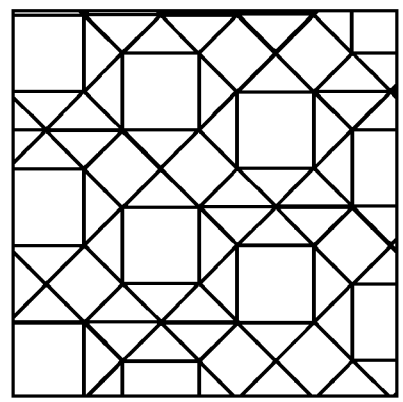

FIGS. 10-14 are top view diagrams depicting possible surface configurations of extraction elements. FIGS. 10 and 11 illustrate regular periodic arrays of extraction elements. FIG. 12 illustrates a random distribution of extraction elements. FIG. 13 illustrates patterned regions of extraction elements. In particular, FIG. 13 illustrates portions of features, possibly in a regular pattern 264 or an irregular pattern 265, interspersed within a different distribution of features 263. The regular or irregular patterns 264 and 265, respectively, along with the different distribution 263 may each have periodic, quasi-periodic, or random distributions of extraction elements. Such regions of patterns may be useful to optimize extraction of particular wavelengths of light at those regions, for example wavelengths corresponding with red, green, and blue light. In that case, the extraction regions can correspond and be aligned the red, green, and blue regions comprising pixels of a display device, and each extraction region can each be optimized to extract light from the corresponding red, green, and blue regions. FIG. 14 illustrates quasicrystal (tiled patterns) of extraction elements.

Examples of techniques for making extraction elements are described in U.S. patent application Ser. No. 11/556,719, filed Nov. 6, 2006, which is incorporated herein by reference. FIGS. 10-14 illustrate possible surface configurations of the nanostructures or other extraction elements described above with a backfill medium providing the planarizing layer over the nanostructures.

Additional techniques could include using lithography or interference lithography to expose nanoscale regions in a photosensitive polymer deposited on a flexible polymer web. After the exposure and development steps, the remaining photosensitive polymer would then define a nanostructured surface. Alternatively, this nanostructured photosensitive polymer surface can serve as an etch mask for exposure of the surface in an etching process. This etching technique would transfer the nanoscale pattern into the surface of the underlying polymer web or into a layer of a harder material, such as a silicon oxide, which had been deposited on the polymer web prior to the lithographic steps. The nanoscale surface defined in any of these manners could then be backfilled with an index contrasting medium to form the light scattering or diffracting layer.

Distributions of Nanoparticles for Light Extraction

This embodiment provides enhanced light extraction from an OLED using an index-contrasting film with randomly distributed high index nanostructures created by coating nanoparticles such as, for example, ITO, silicon nitride ($Si_3N_4$, referred to here as SiN), CaO, $Sb_2O_3$, ATO, $TiO_2$, $ZrO_2$, $Ta_2O_5$, $HfO_2$, $Nb_2O_3$, MgO, ZnO, $In_2O_3$, $Sn_2O_3$, AlN, GaN, TiN, or any other high index materials on a substrate used in OLED fabrication or encapsulation, and then applying a low index coating, such as $SiO_2$, $Al_2O_3$, DLG, DLC, or polymeric materials over the nanoparticles to provide the index contrast needed for scattering or diffraction efficiency and to planarize the surface. The randomly distributed nanostructures can be in contact with the substrate, proximate the substrate, grouped together in places, or in any random configuration proximate the substrate. A converse construction, potentially providing similar effectiveness, can comprise a random distribution of low index nanoparticles or nanostructures such as $SiO_2$, porous $SiO_2$, Borosilicate (BK), $Al_2O_3$, $MgF_2$, CaF, LiF, DLG, DLC, poly(methyl methacrylate) (PMMA), polycarbonate, PET, low index polymers, or any other low index materials with a contrasting high index filler material such as vapor deposited $Si_3N_4$ or a solvent-coated particle-filled polymer or a high index polymer.

Coating processes such as spin coating, dip coating, and knife coating may be used for distributing the nanoparticles on the surface, and a similar process may be used to coat the backfill/planarization layer. The use of such techniques should render the process simple, easily scaled for manufacturing, and suitable for incorporation in film products manufactured via web line or roll-to-roll processes.

One particular method involves applying nanoparticles having a first index of refraction onto a flexible substrate and overcoating a backfill layer on the nanoparticles to form a planarizing layer over them. The backfill layer comprises a material having a second index of refraction different from the first index of refraction. Preferably, a substantial portion of the nanoparticles are within an evanescent zone adjacent to a light emitting region of a self-emissive light source when the optical film is located against the self-emissive light source. For example, a substantial portion of the nanoparticles can be in contact with the substrate to be within the evanescent zone, although in some embodiments the substantial portion of the nanoparticles in the evanescent zone need not be in contact with the substrate.

Applying the nanoparticles can involve coating the nanoparticles dispersed in a solvent onto the flexible substrate and allowing the solvent to evaporate before overcoating the backfill layer. Applying the nanoparticles can also involve applying them in dry form to the flexible substrate and then overcoating them with the backfill layer. An alternative to the method involves using substrate with a release agent, in which the particles are applied to a substrate with a release agent, the substrate with the particles is applied to a device substrate with the particles in contact with it, and then the substrate is released to transfer the particles to the device substrate.

Replication Method

One solution for forming a master tool having nanostructures involves the use of interference lithography. Regular periodic features as small as 100 nm-150 nm can be quickly written using this method. An advantage involves being able to write these patterns over larger areas, which can make the process more amenable to manufacturing.

Production of a master tool for replication of the pattern can involve the following. A substrate is coated with an overlayer of photoresist and then illuminated with one or more UV interference patterns to expose the resist in a regular pattern with the desired feature sizes. Development of the resist then leaves an array of holes or posts. This pattern can subsequently be transferred into the underlying substrate through an etching process. If the substrate material is not suitable to be used as a replication tool, a metal tool can be made using standard electroforming processes. This metal replica would then become the master tool.

Another method involves forming a master tool having randomly-distributed nanostructures. A solution is prepared comprising nanoparticles of the appropriate size and with the appropriate surface modifications to prevent agglomeration. Methods for preparing such solutions are generally specific to the particular nanoparticles to be dispersed; general methods have been described elsewhere, including U.S. Pat. No. 6,936,100 and Molecular Crystals and Liquid Crystals, 444 (2006) 247-255, both of which are incorporated herein by reference. The solution is then coated onto a flexible substrate using one of a variety of solvent coating techniques, including knife coating, dip coating, or spray coating. Pretreatment of the substrate using methods such as plasma etching may be required in order to assure uniformity of the solution coating. After solvent evaporation, the nanoparticles should be distributed in a way that is microscopically random but macroscopically uniform. As was the case with the uniform tool fabrication process described above, this pattern could then be transferred to an underlying substrate material through an etching or embossing process, or a metal tool can be made using standard electroforming processes.

In any of these cases, if a flat master tool has been produced, it or its replicas may then be tiled together to form a larger tool, as described in U.S. Pat. No. 6,322,652, incorporated herein by reference, or may be formed into a cylindrical tool for compatibility with a roll-to-roll replication process.

Once a master tool has been produced, replication of the structure into a polymer can be done using one of a variety of replication processes, including the 3C process. The substrate for this replication could be any polymer sheeting compatible with the chosen replication process; it may be already coated with the ultrabarrier film as described above. Backfilling would then be performed downstream in, for example, a chemical vapor deposition (CVD) or sputtering process which can deposit a high index material, such as SiN or ITO, which is capable of filling the structures and then leveling out into a smooth layer. If SiN is used, this might then be followed by an ITO deposition process if a conductive upper layer is required. Alternatively, the downstream backfilling may be performed in a solvent coating process using suitable materials.

EXAMPLES

Table 4 provides definitions and sources for materials used in the Examples.

TABLE 4

Tetrafluorotetracyanoquinodimethane (FTCNQ, TCI America, Portland, Oregon)
4,4',4"-Tris(N-(3-methylphenyl)-N-phenylamino)triphenylamine (MTDATA, H. W. Sands Corp., Jupiter, Florida)
Aluminum tris(8-hydroxyquinolate) (AlQ, H. W. Sands Corp., Jupiter, Florida)
N,N'-bis(naphthan-2-yl)-N,N'-bis(phenyl)benzidine (NPD, H. W. Sands Corp., Jupiter, Florida)
Coumarin 545T dye (C545T, Eastman Kodak Co., Rochester, New York)
Lithium fluoride (LiF, Alfa Aesar Co., Ward Hill, Massachusetts)
Aluminum (Al, Alfa Aesar Co., Ward Hill, Massachusetts)

Example 1

Periodic Array of Low Index Nanostructures with Thick High Index Vapor-Deposited Backfill A regular periodic array of nanostructures was produced in a low-index polymer layer using interference lithography. It is known that, for 2-beam interference, the peak-to-peak spacing of the fringes is given by $(\lambda/2)/\sin(\theta/2)$, where $\lambda$ is the wavelength and $\theta$ is the angle between the two interfering waves. This technique enables patterning of structures down to periods as small as one half of the exposing wavelength.

For this example, a thin film of UV-sensitive photoresist (PR) was spun onto a thin glass substrate. The PR was then exposed by a two-beam interference pattern from a 325 nm argon ion laser; the periodic patterns of high and low intensity created lines of exposed regions of period 520 nm in the PR. The substrate was then rotated by 90 degrees and another exposure was made. This resulted, after development, in a pattern of square holes in the PR with hole spacing of 520 nm, hole dimension approximately 250 nm, and hole depth approximately 200 nm. This pattern was then backfilled with plasma-enhanced chemical vapor deposition (PECVD) $Si_3N_4$ to a thickness of 1000 nm in the manner described in Example 3.

Example 2

Periodic Array of Low Index Nanostructures with Thinned High Index Planarization Vapor-Deposited Backfill In order to obtain a higher degree of planarization, a thick (1.3 microns) layer of photoresist (such as Shipley PR1813 available from Electronic Materials Inc., Spartanburg, S.C.) was coated on the SiN layer by spin coating using a substrate as prepared in Example 1. Then reactive ion etching (RIE) was performed to etch away the PR and part of the SiN. A reactive ion etch (RIE, Model PlasmaLab™ System100 available form Oxford Instruments, Yatton, UK) was performed according to the conditions described in Table 5.

TABLE 5

Materials/Conditions used for Reactive Ion Etching

| Reactant/Condition | Value |
|---|---|
| $C_4F_8$ | 10-50 sccm (standard cubic centimeters per minute) |
| $O_2$ | 0.5-5 sccm |
| RF power | 50-100 W |
| Inductive Coupling Plasma (ICP) power | 1000-2000 W |
| Pressure | 3-10 mTorr |

This light extraction structure then served as the substrate for deposition of a bottom emitting green OLED in a manner similar to that described in Example 3 except that ITO covered the entire substrate. In this case, the OLED layers were deposited through a 40 millimeters (mm)×40 mm shadow mask in the following order: 3000 Å MTDATA doped with 2.8% FTCNQ/400 Å NPD/300 Å AlQ doped with 1% C545T/200 Å AlQ/7 Å LiF. The 40 mm×40 mm shadow mask was replaced by a mask containing several parallel 3 mm×25 mm openings and through which 2500 Å of Al cathode metal was then deposited. This provided OLED devices containing several independently addressable 3 mm×25 mm pixels.

Light emitted from the cathode stripe from the resulting OLED was observed. The cathode stripe passes over areas with and without the periodic patterns, enabling observation of patterned and unpatterned regions simultaneously, with the same voltage applied across both regions. It was quite apparent that the area with the periodic patterns was brighter than the area without the periodic patterns.

Example 3

Random Distribution of Low-Index Nanoparticles with High-Index Planarization Layer A coating of nanoparticles (NPs) was created on a 50 mm×50 mm glass substrate by applying a commercially-obtained sol of silica ($SiO_2$) NPs to the substrate and drying at 100° C. for 5 minutes. The sol consisted of 46 weight percent of $SiO_2$ nanoparticles suspended in water solution (available from Nalco Company, 1601 W. Diehl Rd., Naperville, Ill. 60563-1198). The particle size in this sol ranges from a 60 nm-300 nm diameter, with an average diameter of 244 nm. Alternatively, it is possible to use particles having at least one dimension (e.g., diameter) in the range 20 nm-1000 nm.

After coating the part of the glass substrate with the nanoparticles, a 300 nm thick layer of silicon nitride ($Si_3N_4$) was coated onto the $SiO_2$-NPs and bare glass portions of the substrate by plasma-enhanced chemical vapor deposition (PECVD, Model PlasmaLab™ System100 available form Oxford Instruments, Yatton, UK), using the parameters described in Table 6.

TABLE 6

Conditions used for depositing SiN layer

| Reactant/Condition | Value |
|---|---|
| $SiH_4$ | 400 sccm |
| $NH_3$ | 20 sccm |
| $N_2$ | 600 sccm |
| Pressure | 650 mTorr |
| Temperature | 60° C. |
| High frequency (HF) power | 20 W |
| Low frequency (LF) power | 20 W |

The refractive index of the SiN core layer was measured using a Metricon Model 2010 Prism Coupler (Metricon Corporation; Pennington, N.J.) and was found to be 1.8. SEM imaging of the resultant SiN surface indicated that the roughness of the $SiO_2$ NP surface had been reduced considerably by the 300 nm SiN coating, although residual deviations remained.

In order to incorporate the index-contrasted nanostructured light-scattering layer into an OLED, 110 nm of ITO was deposited on the SiN through a 5 mm×5 mm pixilated shadow mask to serve as the OLED anode. Subsequently a simple green organic emitting layer and cathode were deposited to complete the OLED. The OLEDs were fabricated by standard thermal deposition in a bell-jar vacuum system. The OLED layers were deposited through a 40 mm×40 mm shadow mask covering the 5 mm×5 mm ITO pixels in the following order: 3000 Å MTDATA doped with 2.8% FTCNQ/400 Å NPD/300 Å AlQ doped with 1% C545T/200 Å AlQ/7 Å LiF. The 5 mm×5 mm shadow mask was then realigned and 2500 Å of Al metal was deposited to form the cathodes contacting the tops of the pixels. This provided OLED devices containing several independently addressable 5 mm×5 mm pixels with some pixels disposed over nanoparticles and other pixels not disposed over the nanoparticles.

Light emitted from the cathodes of the resulting OLEDs was observed. It was apparent that these devices with the nanoparticle coating were qualitatively brighter than the devices prepared under identical conditions but without nanoparticle coatings. Subsequent quantitative measurements on these devices have borne out these results. Significant increases in brightness have been observed for modified devices over those with no modification of the interface, whether driving the devices at the same voltage or the same current. Efficiency measurements (candelas per ampere) show an improvement of about 40% with this simple modification.

Example 4

Random Distribution of High Index Nanoparticles with Low Index Backfill

A coating of high index NPs was created on a glass substrate by applying a commercially-obtained sol of ITO NPs to the substrate and drying at 100° C. for 5 minutes. The sol consisted of 20 weight percent of ITO nanoparticles suspended in a 1:1 isopropanol/water solution (Advanced Nano Products Co., LTD., Chungwon-kun, Chungcheonbuk-do, Korea). The particle size in this sol ranges from a 30 nm-300 nm diameter, with an average diameter of 86 nm. After coating a portion of the glass substrate with the nanoparticles, a 200 nm-400 nm thick layer of silicon oxide was coated onto the ITO-NPs and bare glass portions of the substrate by plasma-enhanced chemical vapor deposition (PECVD, Model PlasmaLab™ System100 available form Oxford Instruments, Yatton, UK), using the parameters described in Table 7.

TABLE 7

Conditions used for depositing $SiO_2$ layer

| Reactant/Condition | Value |
|---|---|
| $SiH_4$ | 200-400 sccm |
| $N_2O$ | 500-1500 sccm |
| $N_2$ | 200-800 sccm |
| Pressure | 400-1600 mTorr |
| Temperature | 60° C. |
| High frequency (HF) power | 50-150 W |

With these parameters, a refractive index of 1.46 can be achieved for the silicon oxide film; the index of the ITO NPs is approximately 1.95. At the completion of the PECVD process, high-index nanoparticles with low-index backfill had been generated. Subsequent deposition of an OLED device on this modified substrate resulted in significant enhancement of the light extracted from the portions of the device that had been patterned with NPs when compared to the unpatterned portions. Efficiency measurements (candelas per ampere) show an improvement of about 60-80% with this simple modification.

Example 5

Production of Nanoscale Structures on Flexible Sheet with Barrier Coating

The experiment began with a film on which oxygen/moisture barrier layers had previously been deposited. This barrier film typically comprises PET overcoated with a first polymer layer and further overcoated with at least two visible light-transmissive inorganic barrier layers separated by at least one second polymer layer. Such barrier films have demonstrated oxygen transmission rates less than 0.005 cc/m$^2$/day at 23° C. and 90% relative humidity and are described in greater detail in, for example, U.S. Pat. Nos. 7,018,713 and 6,231,939, which are incorporated herein by reference.

Samples of these barrier films were cut into small 1 inch×1 inch pieces and cleaned with methanol and distilled water. A layer of photoresist (Shipley UV5) was deposited and then baked at 135° C. for 60 seconds, producing a coating of thickness 0.56 microns. This sample was then exposed to interfering laser beams as described in Example 1 above to produce a square array of exposed elements. The resulting pattern had a periodicity of 1.6 microns in each direction and a duty cycle of approximately 50%. The sample was then placed on a hot plate and baked at 130° C. for 90 seconds. After the sample cooled down it was then place in a developer bath (MF-CD-26 from Rohm&Haas) for 10 seconds with stirring. After drying in air for about 3 hours, the samples were then heated on a hot plate at 130° C. for 1 minute to remove any residual moisture.

The resulting film is an example of nanostructures useful for light extraction disposed on a flexible substrate with an interposed barrier layer. This film corresponds with elements 110, 112 and 114 in FIG. 1 and with elements 126, 124 and 122 in FIG. 2.

Example 6

Random Distribution of High Index Nanoparticles with Low Index Backfill on Flexible Sheet with Barrier Coating The experiment began with a film on which oxygen/moisture barrier layers had previously been deposited. This barrier film typically comprises PET flexible sheet overcoated with a first polymer layer and further overcoated with at least two visible light-transmissive inorganic barrier layers separated by at least one second polymer layer. Such barrier films have demonstrated oxygen transmission rates less than 0.005 cc/m$^2$/day at 23° C. and 90% relative humidity and are described in greater detail in, for example, U.S. Pat. Nos. 7,018,713 and 6,231,939, which are incorporated herein by reference.

Samples of these barrier films were cut into small 2 inch×2 inch pieces. A dip-coating of high index NPs was created on the flexible sheet by applying a commercially-obtained sol of ITO NPs to the substrate and drying at 100° C. for 5 minutes. The sol consisted of 20 weight percent of ITO nanoparticles suspended in a 1:1 isopropanol/water solution (Lot-3M-060330-1, Advanced Nano Products Co., LTD. Chungwon-kun, Chungcheonbuk-do, Korea). The particle size in this sol ranges from a 30 nm-300 nm diameter, with an average diameter of 86 nm. After coating a portion of the flexible sheet substrate with the nanoparticles, a 200 nm-400 nm thick layer of silicon oxide was coated onto the ITO-NPs and bare flexible sheet portions of the substrate by plasma-enhanced chemical vapor deposition (PECVD, Model PlasmaLab™ System100 available form Oxford Instruments, Yatton, UK), using the parameters described in Table 7.

With these parameters, a refractive index of 1.46 can be achieved for the silicon oxide film; the index of the ITO NPs is approximately 1.95. At the completion of the PECVD process, high-index nanoparticles with low-index backfill had been generated. Subsequent deposition of an OLED device on this modified substrate resulted in significant enhancement of the light extracted from the portions of the device that had been patterned with NPs when compared to the unpatterned portions.

Subsequent quantitative measurements on these devices have borne out these results. Significant increases in brightness have been observed for modified devices over those with no modification of the interface, whether driving the devices at the same voltage or the same current. Efficiency measurements (candelas per ampere) show an improvement of about 100% with this simple modification.

The invention claimed is:

1. A light extraction film for use with an organic light emitting diode (OLED) device having a surface that outputs light, comprising:
    a flexible substrate substantially transmissive to light emitted by the OLED device;
    a structured layer of extraction elements disposed on the substrate and having a first index of refraction,
    wherein the extraction elements comprise a nanostructured surface of the structured layer on a side of the structured layer opposite the substrate,
    wherein the nanostructured surface comprises non-particle based features in the structured layer;
    a backfill layer comprising a material having a second index of refraction different from the first index of refraction, wherein the backfill layer forms a planarizing layer over the nanostructured surface, forming a planar surface on a side of the backfill layer opposite the nanostructured surface,
    wherein a substantial portion of the extraction elements are within an evanescent zone of the light output surface of the OLED device when the planar surface of the backfill layer is located against the light output surface of the OLED device, and
    wherein the structured layer and backfill layer are in sufficient proximity to the light output surface of the OLED device when the planar surface of the backfill layer is located against the light output surface of the OLED device in order to at least partially enhance the extraction of light from the light output surface; and
    an optical coupling layer located on the planar surface of the backfill layer, wherein the optical coupling layer comprises an adhesive providing for optical coupling between the light output surface of the OLED device and the backfill layer,
    wherein the backfill layer comprises a non-scattering nanoparticle filled polymer material.

2. The light extraction film of claim 1, wherein the non-particle based features comprise a nanoscale pattern in the structured layer.

3. The light extraction film of claim 1, wherein the non-particle based features comprise a pattern of holes in the structured layer.

4. The light extraction film of claim 1, wherein the non-particle based features comprise photonic crystal structures.

5. The light extraction film of claim 1, wherein the non-particle based features have a periodic distribution.

6. The light extraction film of claim 1, wherein the non-particle based features have a quasi-periodic distribution.

7. The light extraction film of claim 1, wherein the non-particle based features have a random distribution.

8. The light extraction film of claim 1, wherein the non-scattering nanoparticles in the nanoparticle filled polymer material have a size between 4 nanometers and 20 nanometers.

* * * * *